United States Patent
Huang et al.

(10) Patent No.: US 6,964,926 B2
(45) Date of Patent: Nov. 15, 2005

(54) METHOD OF FORMING GEOMETRIC DEEP TRENCH CAPACITORS

(75) Inventors: Tse-Yao Huang, Taipei (TW); Yi-Nan Chen, Taipei (TW); Tzu-Ching Tsai, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 26 days.

(21) Appl. No.: 10/727,924

(22) Filed: Dec. 4, 2003

(65) Prior Publication Data

US 2004/0266098 A1 Dec. 30, 2004

(30) Foreign Application Priority Data

Jun. 27, 2003 (TW) ........................................ 92117540 A

(51) Int. Cl.⁷ ............................................ H01L 21/308
(52) U.S. Cl. ........................ 438/700; 438/242; 438/243; 438/244; 438/386; 438/387; 438/396; 438/702; 438/756; 438/757; 438/787; 438/791; 438/942
(58) Field of Search ................................ 438/242, 243, 438/244, 386, 387, 396, 700, 702, 756, 757, 787, 791, 942, FOR 220

(56) References Cited

U.S. PATENT DOCUMENTS

| 5,686,345 | A | * | 11/1997 | Harmon et al. ............. 438/702 |
| 6,150,211 | A | * | 11/2000 | Zahurak ...................... 438/244 |
| 6,352,931 | B1 | * | 3/2002 | Seta et al. .................. 438/700 |
| 6,504,107 | B1 | * | 1/2003 | Kragl .......................... 174/260 |
| 6,528,428 | B1 | * | 3/2003 | Chen et al. ................. 438/700 |
| 6,605,542 | B2 | * | 8/2003 | Seta et al. .................. 438/700 |
| 6,734,077 | B2 | * | 5/2004 | Forster et al. .............. 438/386 |
| 6,821,913 | B2 | * | 11/2004 | Chuang et al. ............. 438/786 |
| 2001/0023956 | A1 | * | 9/2001 | Collins et al. ............. 257/301 |
| 2002/0039836 | A1 | * | 4/2002 | Venkatesan et al. ........ 438/622 |
| 2002/0127803 | A1 | * | 9/2002 | Schlosser et al. ........... 438/258 |
| 2003/0068867 | A1 | * | 4/2003 | Forster et al. ............. 438/386 |
| 2004/0095896 | A1 | * | 5/2004 | Chudzik et al. ............ 370/254 |

* cited by examiner

*Primary Examiner*—George Fourson
*Assistant Examiner*—Joannie Adelle Garcia
(74) *Attorney, Agent, or Firm*—Quintero Law Office

(57) ABSTRACT

A method of forming capacitors with geometric deep trenches. First, a substrate with a pad structure formed thereon is provided, and a first hard mask layer is formed on the pad structure. Next, a second hard mask layer is formed on the first hard mask layer. Next, a spacer layer is formed in the first opening on the first hard mask layer to expose a second opening. Next, a third hard mask layer is filled the second opening, and the spacer layer is removed. Next, the first hard mask layer is etched to expose a third opening with a salient of the first hard mask layer, with the second hard mask layer and the third hard mask layer acting as masks. Finally, the first hard mask layer, the pad structure, and the substrate are etched to form a geometric deep trench.

24 Claims, 8 Drawing Sheets

METHOD OF FORMING GEOMETRIC DEEP TRENCH CAPACITORS

BACKGROUND OF THE INVENTION

1. Field of the Invention

The present invention relates to a field emission display (FED) and fabrication method thereof, and more specifically to a triode-type field emission display (FED) having a grid plate with spacer structure and fabrication method thereof.

2. Description of the Related Art

With the wide application of integrated circuits (ICs), various semiconductor devices with higher efficiency and lower cost are produced based on different objectives. DRAM is important in the information and electronics industry, with memory capacity a key characteristic thereof.

Most DRAM has one transistor and one capacitor per DRAM cell. Memory capacity of the DRAM has reached 256, and even 512 MB. Therefore, with increased integration, reduced size of memory cell and transistor is important in manufacture of DRAM with higher memory capacity and higher processing speed. 3-D capacitors such as a deep trench capacitor can itself reduce footprint on the semiconductor substrate, and thus, is applied to fabrication of the DRAM of 512 MB and above. A traditional plane transistor covers considerable area of the semiconductor substrate, creating problems for integration. Therefore, vertical transistors are becoming popular for fabrication of memory units. One of the most used DRAM cell arrays integrates vertical transistors with trench capacitors.

Nevertheless, as the size of elements is continuously reduced, so is trench storage node capacitance of DRAM. As a result, storage capacitance must be increased to maintain performance. Even though the storage capacitance can be increased by increasing the depth of the deep trench capacitor, finite depth limits the high aspect ratio capacitor process.

Currently, the method for increasing storage capacitance for DRAMs increases the width of the bottom of the trench, thereby increasing surface area to form a bottle-shaped trench capacitor.

FIGS. 1a to 1c are cross-sections illustrating the conventional process flow for forming a bottle trench. First, referring to FIG. 1a, a patterned pad layer 12 is formed on a silicon substrate 10. Then, the patterned pad layer 12 is used as an etching mask to etch the silicon substrate 10 by dry etching to form a trench 14 containing an upper portion 16 of width 13 and a lower portion 18.

Next, referring to FIG. 1b, a photoresist layer 22 covering the lower portion 18 of the trench 14 is formed. Subsequently, a sacrificial layer 20 covering the upper portion 16 of the trench 14 and the pad layer 12 is deposited. Then, referring to FIG. 1c, the photoresist layer 22 and the sacrificial layer 20 from the pad layer 12 are later removed by anisotropic etching. As a result, a residual sacrificial layer 21 is formed in the upper portion 16 of the trench 14.

Finally, referring to FIG. 1d, the silicon substrate 10 uncovered by the residual sacrificial layer 21 of the lower portion 18 of the trench 14 is etched by isotropic etching using ammonia and diluted hydrogen fluoride to form the lower portion 24 of the bottle shaped trench 17. The lower portion 24 is wider (at width 15) than the upper portion 16 (at width 13).

It is difficult to control the shape of the lower portion 22 of the trench 14 by the above method, which results in increased instability and difficulty during the fabricating process.

Therefore, a manufacturing process of trench capacitor with increased storage capacitance, in which trench depth and bottom width are not increased, is called for.

SUMMARY OF THE INVENTION

Accordingly, an object of the present invention is to provide a method of forming capacitors for which the manufacturing process is simplified and storage capacitance is increased to accommodate increased integration.

Another object of the present invention is to provide a method of capacitors formation to facilitate increased storage capacitance utilizing a geometric deep trench, without increasing the width of the trench bottom.

To achieve the first object, the present invention provides a method of forming capacitors having geometric deep trenches.

First, a substrate is provided, with a pad structure and a first hard mask layer formed sequentially thereon.

Next, a patterned second hard mask layer is formed on the first hard mask layer.

Next, a spacer layer is formed in the first opening on the first hard mask layer to expose a second opening.

Next, a third hard mask layer is formed to fill the second opening, and the spacer layer is then removed.

Next, the first hard mask layer is etched to expose a third opening with a salient of the first hard mask layer, with the second hard mask layer and the third hard mask layer acting as masks.

Finally, the first hard mask layer, the pad structure, and the substrate are etched simultaneously to form a geometric deep trench in the substrate.

In the present invention, the process of etching the first hard mask layer, the pad structure, and the substrate simultaneously to form a geometric deep trench in the substrate further comprises the following steps.

First, the first hard mask layer, the salient of the first hard mask, and the substrate are etched to remove the salient of the first hard mask layer completely, and a doughnut-shaped hollow of the substrate is formed.

The doughnut-shaped hollow of the substrate and the pad structure are then etched sequentially to form the geometric deep trench.

According to one aspect of the present invention, the width of the second opening is in inverse ratio to that of the subsequently formed spacer layer.

In another aspect of the present invention, the width of the salient of the first hard mask layer is in direct ratio to that of the second opening.

The present invention also provides another method of forming capacitors having geometric deep trench, including the following steps.

First, a substrate with a pad structure s provided, wherein the pad structure comprises a pad oxide layer and a pad nitride layer formed thereon.

A first hard mask layer is formed on the substrate, followed by a patterned second hard mask layer to expose a first opening.

Next, a spacer layer is formed in the first opening on the first hard mask layer to expose a second opening.

Next, a third hard mask layer is formed to fill the second opening.

Next, the third hard mask layer is subjected to a flattening process to remove the third hard mask layer from the second opening.

Next, the spacer layer is removed completely by etching.

Next, the first hard mask layer is etched to expose a third opening with the salient of the first hard mask layer, with the second hard mask layer and the third hard mask layer acting as masks.

Next, the first hard mask layer, the salient of the first hard mask, and the substrate are etched to remove the salient of the first hard mask layer completely, and a doughnut-shaped hollow in the substrate is formed.

Finally, the hollow and the pad structure are etched to form a geometric deep trench in the substrate.

According to the present invention, the method of forming capacitors having geometric deep trench further comprises, after etching the doughnut-shaped hollow in the substrate, the following steps.

A buried plate is formed parts of the substrate of the geometric deep trench.

A collar insulating layer and at least one conductive layer are formed in the geometric deep trench.

A detailed description is given in the following embodiments with reference to the accompanying drawings

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiments are intended to illustrate the invention more fully without limiting the scope of the claims, since numerous modifications and variations will be apparent to those skilled in this art.

FIGS. 2a to 2j are cross sections illustrating the manufacturing processes of a preferable embodiment according to the present invention.

Figure 1B:
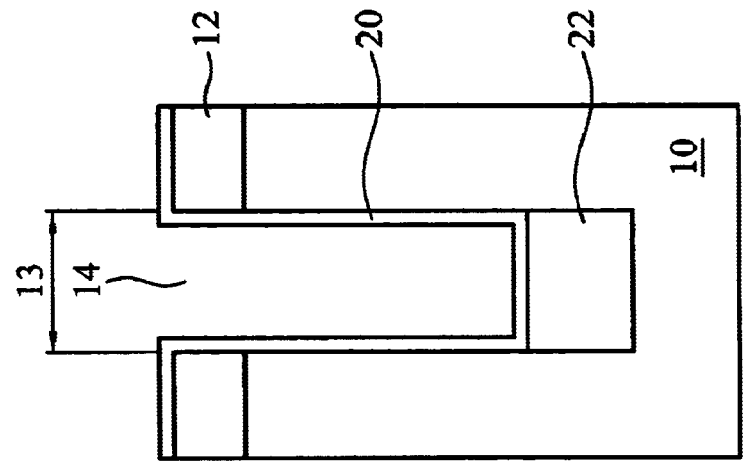
FIGS. 1a to 1d are cross sections illustrating the manufacturing process of a conventional bottle-shaped trench capacitor.
Figure 1A:
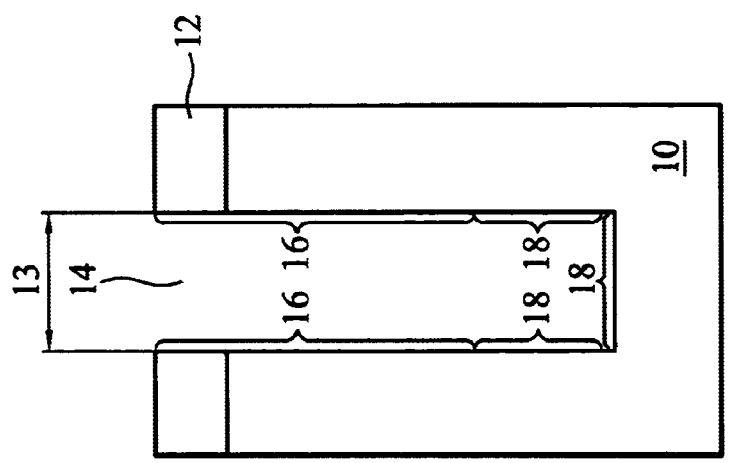
Figures 1C, 1D:
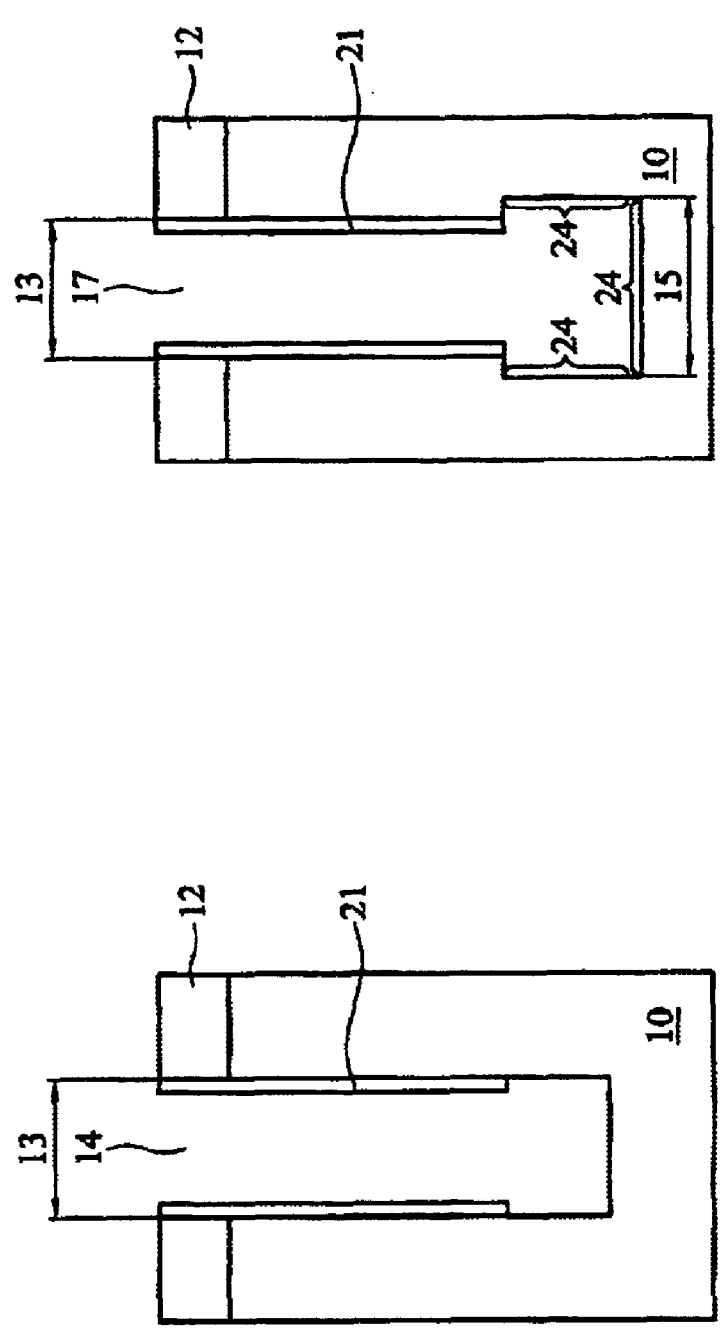
Figure 2B:
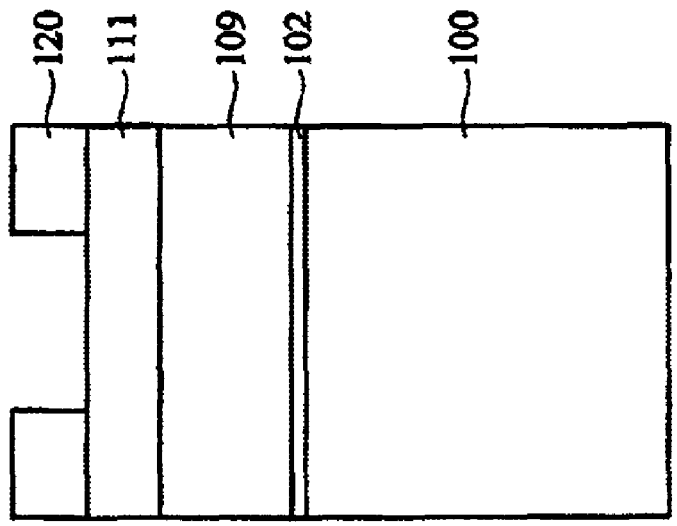
FIGS. 2a to 2k are cross sections illustrating the manufacturing process of capacitors having geometric deep trenches in accordance with the present invention.
Figure 2A:
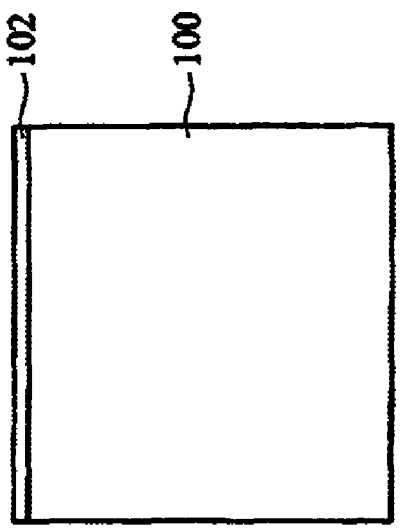

First, referring to FIG. 2a, a semiconductor substrate 100, such as a p-type silicon substrate or n-type silicon substrate is provided. Herein, use of the term substrate includes devices formed within a semiconductor wafer and the layers overlying the wafer. Next, a pad structure 102 is formed on the substrate 100. The pad structure 102 can comprise a pad oxide layer or a pad nitride layer, wherein the pad oxide layer can be formed on the substrate in advance, and a pad nitride layer formed on the pad oxide layer subsequently. Preferably, the pad oxide layer, such as silicon oxide with a thickness of 50Å to 300Å, is formed using thermal oxidation at 850–950° C., APCVD, or LPCVD. The pad nitride layer such as silicon nitride with a thickness of 1000Å to 2000Å is formed using LPCVD at 750–800° C., wherein $SiCl_2H_2$ and $NH_3$ are reactants.

Subsequently, referring to FIG. 2b, a first hard mask layer 109 is formed on the pad structure 102, and a second hard mask layer 111 is formed on the first hard mask layer 109. Next a photoresist pattern 120 is formed on the second hard mask layer 111 by photolithography. Suitable material for the first hard mask layer 109 is silicide, such as boro phosphor silicate glass (BPSG), phosphor silicate glass (PSG), boro silicate glass (BSG), or arsenic silicate glass (AsSG). Preferably, the first hard mask layer 109 of BSG with a thickness of 8000 to 15000Å, such as 13000Å, is formed by LPCVD, wherein $SiH_4$, $BF_3$, and $B_2H_6$ are reactants. Suitable material for the second hard mask layer 111 is polysilicon or doped polysilicon. Preferably, the second hard mask layer 111 of polysilicon with a thickness of 500 to 5000Å is formed by LPCVD at 500–650° C. with doped ion concentration between 1E20 to 1E21 atoms/cm$^3$, wherein $PH_3$, $SiH_4$, and $N_2$ are reactants. The thickness of the second hard mask layer 111 can be 3000Å in this embodiment.

Figure 2C:
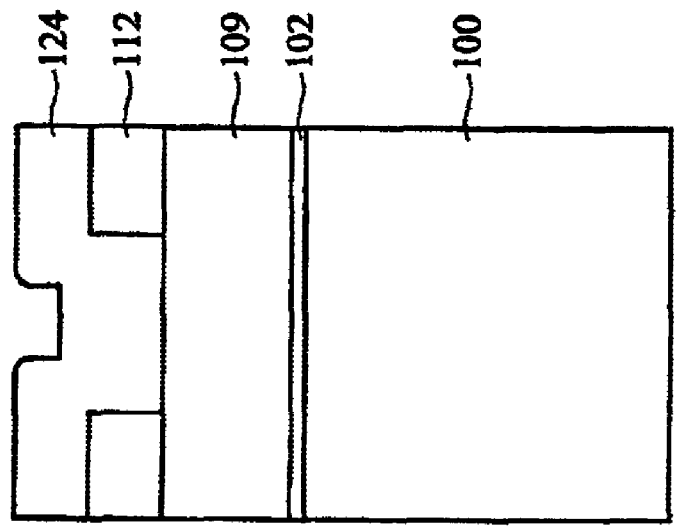

Subsequently, referring to FIG. 2c, the second hard mask layer 111 is etched anisotropically with the photoresist pattern 120 acting as a mask, to form a first opening 130 and expose the first hard mask layer 109. Preferably, the anisotropic etching process can be MERIE, ECR or RIE with reactants comprising $SF_6$, $O_2$, $Cl_2$, HBr, or a combination thereof.

Figure 2D:
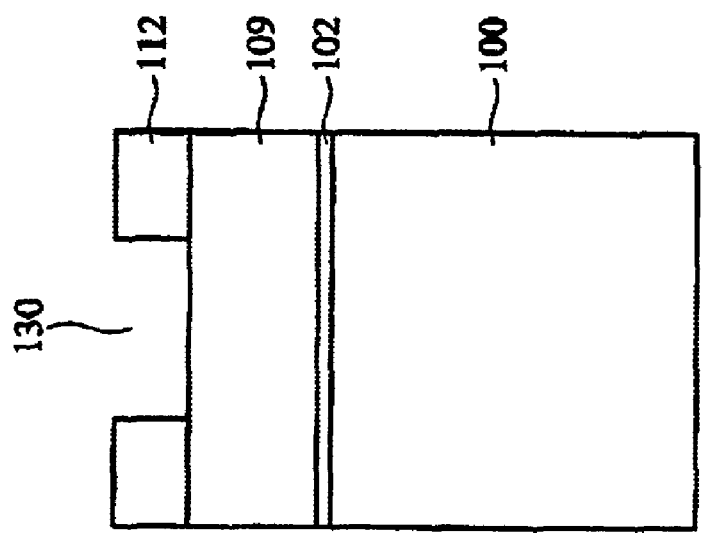

Subsequently, referring to FIG. 2d, the photoresist pattern 120 is removed, and a spacer layer 124 formed conformally on the first hard mask layer 109 and the etched second hard mask layer 112 and in the first opening 130. Suitable material for the spacer layer 124 is dielectric material such as silicon nitride, and the spacer layer 124 can be formed by a method such as LPCVD, PECVD, HDPCVD, APCVD, or SACVD.

Figure 2F:
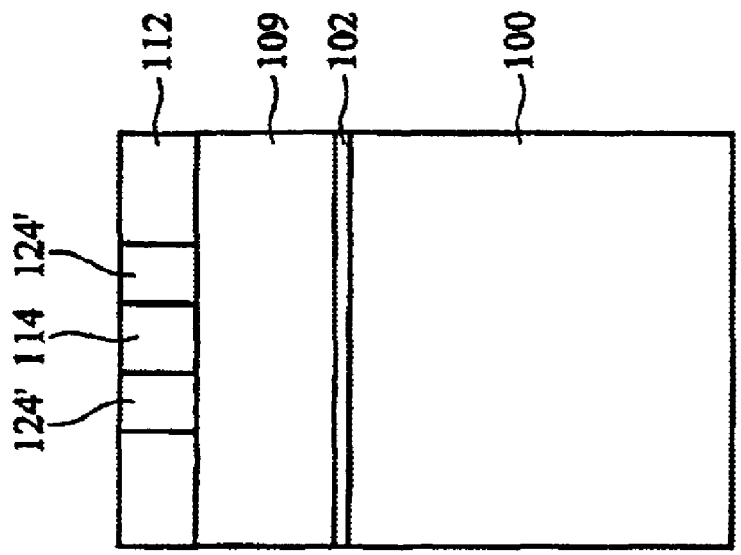
Figure 2E:
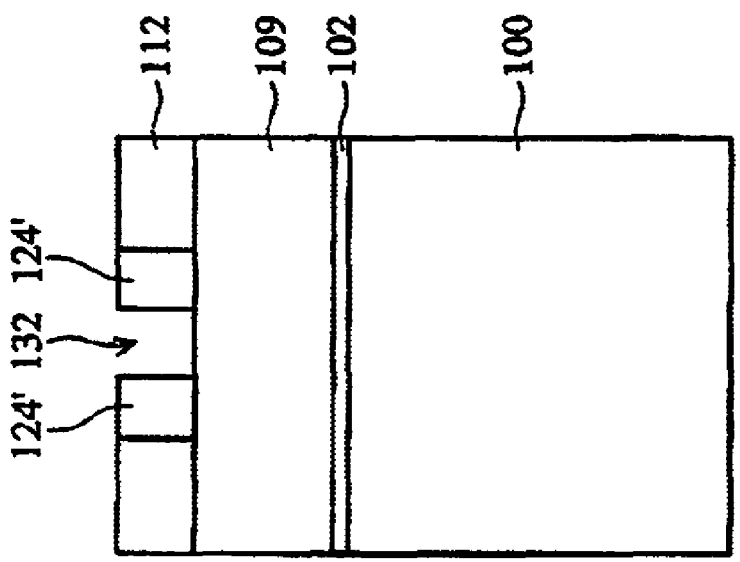
Figure 2H:
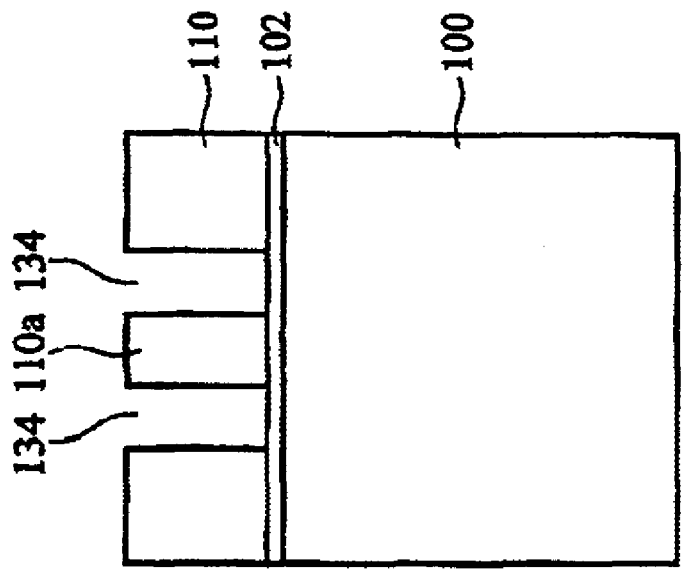

Subsequently, referring to FIG. 2e, the spacer layer 124 is etched anisotropically, for example as RIE, to remove the spacer layer 124 from the etched second hard mask layer 112 and an etched spacer layer 124' is formed into the first opening 130 to form a second opening 132, by a self-aligned etching step resulting in a precise scale of the second opening 132.

Subsequently, referring to FIG. 2f, a third hard mask layer 114 is formed on the above structure to fill the second opening 132. Herein, the third hard mask layer 114 can be subjected to a flattening process to remove the part of the third hard mask layer 114 outside the second opening 132. Suitable materials for third hard mask layer 114 and second hard mask layer 111 can be the same or different. Furthermore, the materials of third hard mask layer 114 and the second hard mask layer 111 are different from those of the first hard mask layer 109. The suitable material of the third hard mask layer 114 can be polysilicon. Preferably, the third hard mask layer 114 of polysilicon is formed by LPCVD at 500–650° C. In addition, the flattening process can be chemical mechanical polishing.

Figure 2G:
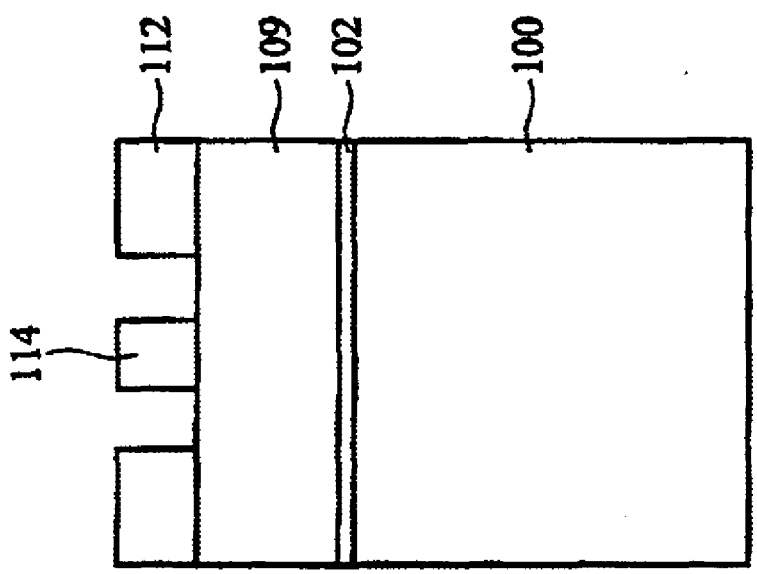

Subsequently, referring to FIG. 2g, the etched spacer layer 124' is removed completely by, for example a hot phosphoric acid solution, to expose the first hard mask layer 109. Next, referring to FIG. 2h, the first hard mask layer 109 is etched to expose a third opening 134 with a salient 110a of the etched first hard mask layer 110, with the etched second hard mask layer 112 and the third hard mask layer 114 acting as masks. Next, the etched second hard mask layer 112 and the third hard mask layer 114 are removed.

Figure 2J:
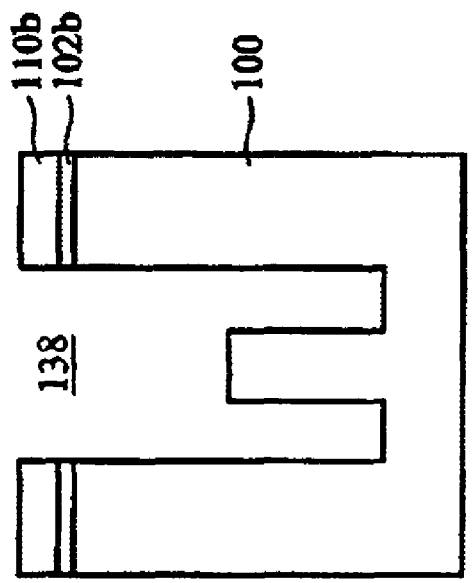
Figure 2I:
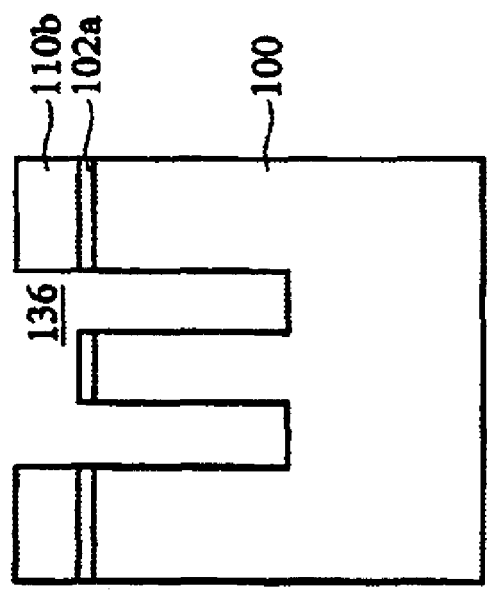

Subsequently, referring to FIG. 2i, the salient 110a of the etched first hard mask layer 110, the etched first hard mask layer 110, and the substrate 100 are etched to remove the salient 110a of the etched first hard mask layer 110 completely, with the etched first hard mask layer 110 beyond the third opening 134 acting as a sacrifice layer to protect the substrate 100 under the etched first hard mask layer 110, resulting in a doughnut-shaped hollow 136 in the substrate 100 formed by etching of the substrate 100. When the salient 110a is removed completely by etching, the etched first hard mask layer 110 beyond the third opening 134 is etched to form a residual first hard mask layer 110b simultaneously, due to salient 110a having a higher etching rate than the etched first hard mask layer 110. Furthermore, the pad structure 102 is etched to form a first etched pad structure 102a.

Subsequently, referring to FIG. 2j, the doughnut-shape hollow 136 of the substrate 100 and the first etched pad structure 102a are etched by anisotropic etching such as RIE, with the residual first hard mask layer 110b acting as a mask, form the geometric deep trench 138 and a second etched pad structure 102b. Moreover, an additional sacrificial layer can be formed on the residual first hard mask layer 110b to maintain the entire sacrificial layer, comprising the residual first hard mask layer 110b and the additional sacrificial layer, has a thickness sufficient to protect the substrate 100 during the etching of the doughnut-shaped hollow 136 of the substrate 100.

Figure 2K:
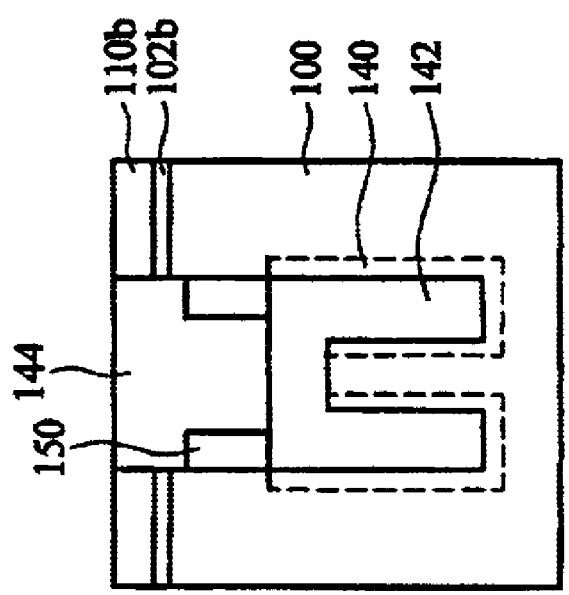

Finally, referring to FIG. 2k, a buried plate 140, a collar insulating layer 150, and a first conductive layer 142 and second conductive layer 144 are formed to the geometric deep trench 138. Preferably, doped ASG and TEOS are formed into the trench 138 and heated to form the buried plate 140 by driving.

The capacitors fabricated by the method according to the present invention allow large increments of surface area and improvements of the storage capacitance for the capacitors, without the conventional complicated process on failing increased width and depth of a capacitor trench. The method of forming capacitors in accordance with the present invention solves the previously described problem resulting from the geometric deep trench of the capacitor.

Moreover, due to the decreased width of capacitor trench, it is extremely difficult to form a geometric deep trench with precise scale by photolithography. The method of forming capacitors having geometric deep trench according to the present invention employs a self-aligned etching step to form the geometric deep trench with a salient thereinto. The self-aligned etching step allows capacitors with narrow geometric deep trench to be fabricate, even under the 0.11-Micron DRAM process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming capacitors having geometric deep trenches, comprising:
   providing a substrate;
   forming a pad structure on the substrate;
   forming a first hard mask layer on the substrate;
   forming a patterned second hard mask layer on the first hard mask layer to expose a first opening;
   forming a spacer layer in the first opening on the first hard mask layer to expose a second opening;
   forming a third hard mask layer to fill the second opening;
   removing the spacer layer to expose the first hard mask layer;
   etching the first hard mask layer, with the second hard mask layer and the third hard mask layer acting as masks, to form a third opening with a salient of the first hard mask layer therein;
   removing the second hard mask layer and the third hard mask layer; and
   etching the first hard mask layer, the salient of the first hard mask layer, the pad structure, and the substrate to form a geometric deep trench in the substrate.

2. The method as claimed in claim 1, after forming the third hard mask layer to fill the second opening, further comprising subjecting the third hard mask layer to a flattening process to remove the third hard mask layer beyond the second opening.

3. The method as claimed in claim 2, wherein the flattening process is chemical mechanical polishing.

4. The method as claimed in claim 1, wherein the first hard mask layer is BPSG, AsSG, PSG, or BSG.

5. The method as claimed in claim 1, wherein the second hard mask layer is polysilicon or doped polysilicon.

6. The method as claimed in claim 1, wherein the third hard mask layer and the second hard mask layer are the same material.

7. The method as claimed in claim 1, wherein the spacer layer is dielectric material.

8. The method as claimed in claim 1, further comprising conformally forming the spacer layer with LPCVD, PECVD, HDPCVD, APCVD, or SACVD.

9. The method as claimed in claim 1, wherein the pad structure comprises a pad oxide layer and a pad nitride layer, and the steps of forming the pad structure comprise:
   forming a pad oxide layer on the substrate; and
   forming a pad nitride layer on the pad oxide layer.

10. The method as claimed in claim 1, wherein the process of forming the geometric deep trench in the substrate comprises:
    etching the first hard mask layer, the salient of the first hard mask layer, and the substrate to remove the salient of the first hard mask layer completely to form a doughnut-shaped hollow in the substrate; and
    etching the doughnut-shaped hollow of the substrate and the pad structure to form the geometric deep trench in the substrate.

11. The method as claimed in claim 1, wherein the first hard mask layer is etched to form a residual first hard mask layer simultaneously, when the salient of the first hard mask layer is removed completely by etching.

12. The method as claimed in claim 1, wherein a width of the second opening is in inverse ratio to a thickness of the space layer.

13. The method as claimed in claim 12, wherein a width of the salient of the first hard mask layer is in direct ratio to a width of the second opening.

14. The method as claimed in claim 1, further comprising, after forming a geometric deep trench in the substrate, the steps of:
    forming a buried plate in parts of the substrate of the geometric deep trench; and
    forming a collar insulating layer and at least one conductive layer in the geometric deep trench.

15. A method of forming capacitors having geometric deep trenches, comprising:
    providing a substrate;
    forming a pad structure on the substrate, comprising pad oxide layer and a nitride layer formed on the substrate sequentially;

forming a first hard mask layer on the substrate;

forming a patterned second hard mask layer on the first hard mask layer to expose a first opening;

forming a spacer layer in the first opening on the first hard mask layer to expose a second opening;

forming a third hard mask layer to fill the second opening;

performing a flattening process to remove the third hard mask layer beyond the second opening;

removing the spacer layer to expose to the first hard mask layer;

etching the first hard mask layer, with the second hard mask layer and the third hard mask layer acting as masks, to form a third opening with a salient of the first hard mask layer therein;

removing the second hard mask layer and the third hard mask layer;

etching the first hard mask layer, the salient of the first hard mask layer, and the substrate to remove the salient of the first hard mask layer completely to form a doughnut-shaped hollow in the substrate; and etching the doughnut-shaped hollow of the substrate and the pad structure to form a geometric deep trench in the substrate.

16. The method as claimed in claim 15, wherein the flattening process is chemical mechanical polishing.

17. The method as claimed in claim 15, wherein formation of the pad oxide layer of the pad structure uses thermal oxidation.

18. The method as claimed in claim 15, wherein the first hard mask layer is BPSG, AsSG, PSG, or BSG.

19. The method as claimed in claim 15, wherein the second hard mask layer is polysilicon or doped polysilicon.

20. The method as claimed in claim 15, wherein the third hard mask layer and the second hard mask layer are the same material.

21. The method as claimed in claim 15, wherein the spacer layer is dielectric material.

22. The method as claimed in claim 15, wherein conformal formation of the spacer layer uses LPCVD, PECVD, HDPCVD, APCVD, or SACVD.

23. The method as claimed in claim 15, wherein the first hard mask layer is etched to form a residual first hard mask layer simultaneously, when the salient of the first hard mask layer is removed completely by etching.

24. The method as claimed in claim 15, further comprising, after forming a geometric deep trench in the substrate:

forming a buried plate in parts of the substrate of the geometric deep trench; and forming a collar insulating layer and at least one conductive layer in the geometric deep trench.

* * * * *